United States Patent [19]

Suzuki

[11] Patent Number: 5,474,877
[45] Date of Patent: Dec. 12, 1995

[54] METHOD FOR DEVELOPING A RESIST PATTERN

[75] Inventor: Katsumi Suzuki, Tokyo, Japan

[73] Assignee: NEC Corporation, Tokyo, Japan

[21] Appl. No.: 201,339

[22] Filed: Feb. 24, 1994

[51] Int. Cl.⁶ .............................. G03F 7/40; G03F 7/30
[52] U.S. Cl. .................... 430/325; 430/330; 430/322
[58] Field of Search ........................... 430/325, 330, 430/331, 322

[56] References Cited

U.S. PATENT DOCUMENTS

| | | | |
|---|---|---|---|
| 5,212,043 | 5/1993 | Yamamoto | 430/325 |
| 5,223,377 | 6/1993 | Samarakone et al. | 430/330 |

FOREIGN PATENT DOCUMENTS

| | | | |
|---|---|---|---|
| 0224273 | 6/1987 | European Pat. Off. | |
| 52-058374 | 5/1977 | Japan | 430/330 |
| 58-102942 | 6/1983 | Japan | |
| 62-189462 | 8/1987 | Japan | 430/330 |
| 62-274720 | 11/1987 | Japan | |
| 63-2046 | 1/1988 | Japan | 430/330 |
| 63-197331 | 8/1988 | Japan | |
| 3-263816 | 11/1991 | Japan | 430/331 |

*Primary Examiner*—Kathleen Duda
*Attorney, Agent, or Firm*—Young & Thompson

[57] ABSTRACT

A photoresist pattern developed on a semiconductor substrate is rinsed by rinsing liquid. At this rinsing step, the rinsing liquid is heated to be decreased in surface tension, so that the collapse of the photoresist pattern is avoided.

6 Claims, 5 Drawing Sheets

METHOD FOR DEVELOPING A RESIST PATTERN

FIELD OF THE INVENTION

This invention relates to a method for developing a resist pattern, and more particularly to, a method for avoiding the collapse of a developed resist pattern at the time of rinsing the surface of the resist pattern.

BACKGROUND OF THE INVENTION

In the process of fabricating a semiconductor device, a predetermined pattern is transferred to or drawn on a resist film having a thickness of approximately 1 µm or more appropriately covering the surface of a semiconductor substrate usually having minute unevenness thereon. Then, the semiconductor substrate is processed by, for instance, adopting photolithography using the resist pattern thus obtained as a protective mask pattern.

In accordance with the conventional photolithography technology, it is very difficult that a sufficient focal depth is obtained to resolve a fine pattern of approximately 0.3 µm or less with a predetermined precision, even if a wavelength of light for transferring a mask pattern to a semiconductor substrate is shortened, and a numerical aperture of a reducing projection lens is optimized. For this reason, there is the necessity to adopt a technology such as X-ray lithography, etc. having a high resolution and a large focal depth. In case where a resist film exposed to a pattern by the X-ray lithography is developed, an ordinary resist film coating and developing apparatus is used. The apparatus is provided with a mount for a semiconductor substrate which is rotated by a motor. In the apparatus, a semiconductor substrate covered with a resist film is fixed on the mount by a vacuum chuck provided thereon. Then, developer is supplied on the resist film which is rotated along with the substrate fixed to the mount by the motor, so that a predetermined pattern is developed on the resist film. Subsequently, the developed resist film is rinsed on the mount in accordance with the supply of pure water, alcohol, etc. thereto under the situation where it is rotated along with the substrate by the motor. Finally, the resist pattern thus developed is dried on the mount.

Such a conventional developing apparatus is described in the Japanese Utility Model Kokai No. 63-197331. The developing apparatus comprises a spin head having a spiral pipe therein for flowing liquid therethrough. In the developing apparatus, the liquid of a predetermined temperature is flown through the spiral pipe, so that the temperature distribution of developer supplied on a resist film is uniform to enhance the resist pattern precision.

In the conventional developing apparatus, however, there is a disadvantage in that a resist pattern is collapsed due to surface tension of rinsing liquid flown into minute interstices of the developed resist pattern at the stage of rinsing the developed resist pattern, especially, when an aspect ratio which is a ratio between dimensions of longitudinal and transverse sides of the pattern becomes large, despite that any kind of a resist film is used.

This disadvantage is observed even in case where the X-ray lithography providing a predetermined precision in the transfer of a super-minute pattern is used.

SUMMARY OF THE INVENTION

Accordingly, it is an object of the invention to provide a method for developing a resist pattern in which the collapse of the resist pattern is avoided by relieving the surface tension of the rinsing liquid.

According to the invention, a method for developing a resist pattern, comprises the steps of:
 coating a photoresist film on a semiconductor substrate;
 exposing the photoresist film on the semiconductor substrate to an arbitrary pattern;
 supplying developer on the photoresist film on the semiconductor substrate to develop the photoresist pattern; and
 supplying rinsing liquid on the photoresist pattern developed on the semiconductor substrate to rinse the photoresist pattern, a surface of the semiconductor substrate having the photoresist pattern thereon being heated to be a predetermined temperature at the rinsing liquid supplying step.

In the invention, the rinsing liquid is water and/or alcohol, and the semiconductor substrate is heated to be a predetermined temperature, so that the rinsing liquid is heated to the boiling point thereof or less by several degrees. Thus, the rinsing liquid is reduced in surface tension at the rinsing step, and the evaporation of the rinsing liquid is accelerated out of the semiconductor substrate in cooperation with the spin effect generated by the rotation of a semiconductor substrate holder.

BRIEF DESCRIPTION OF THE DRAWINGS

The invention will be explained in more detail in conjunction with the appended drawings, wherein.

DESCRIPTION OF THE PREFERRED EMBODIMENTS

Figure 1:
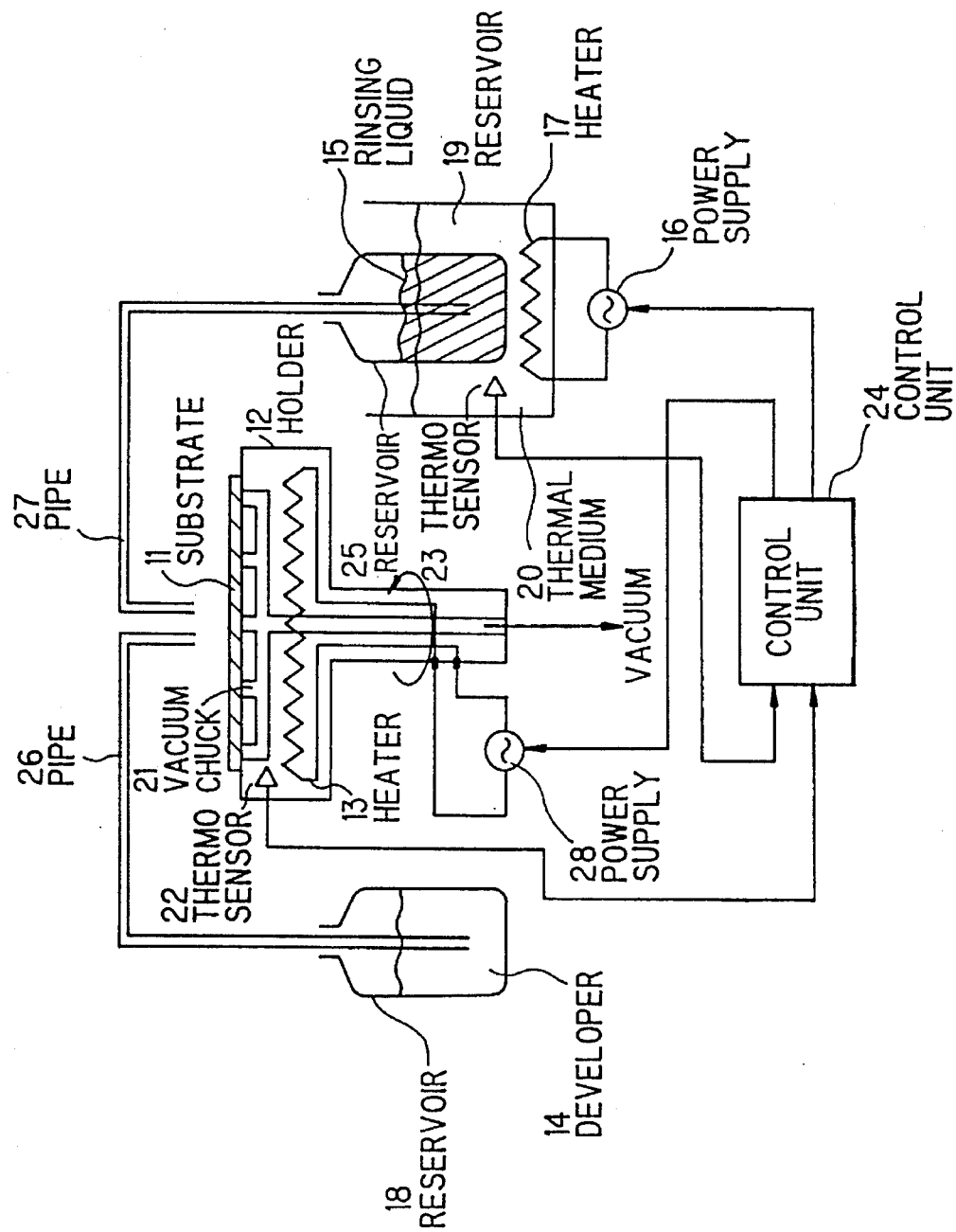
FIG. 1 is an explanatory view explaining a method for developing a photoresist pattern in a first preferred embodiment according to the invention.

FIG. 1 shows a resist pattern developing apparatus in which a method for developing a resist pattern in the first preferred embodiment according to the invention is carried out. The resist pattern developing apparatus comprises a holder (or mount) 12 for holding a semiconductor substrate 11 coated with a resist film (not shown) to be developed, a vacuum chuck 21 for holding the semiconductor substrate 11 fixed on the holder 12 by vacuum, a heater 13 buried in the holder 12 for heating the semiconductor substrate 11 to 50' to 100° C., a power supply 28 for applying a voltage to the heater 13, a thermosensor 22 for sensing the temperature of the holder 12 (and the semiconductor substrate 11), a reservoir 18 for containing developer 14, a pipe 26 for supplying the developer 14 to the resist film on the semiconductor substrate 11 by using a pump (not shown), a reservoir 19 for containing thermal medium (water or oil) 20, a reservoir 25 for containing rinsing liquid (pure water, alcohol, etc.) 15, a heater 17 for heating the thermal medium 20 to transfer the heat to the rinsing liquid 15, a power supply 16 for applying a voltage to the heater 17, a thermal-sensor 23 for sensing the temperature of the thermal medium 20, a pipe 27 for supplying the rinsing liquid 15 to a developed resist pattern, and a control unit 24 for controlling the power supplies 16 and 28 to be turned on and off by receiving sensor signals from the thermo-sensors 22 and 23.

In operation, the semiconductor substrate 11 having the resist film is fixed on the holder 12 by the vacuum chuck 21 using vacuum, and the holder 12 is rotated together with the semiconductor substrate 11 by a motor (not shown). In this situation, the power supply 28 is turned on to activate the heater 13 by the control unit 24 receiving a temperature signal from the thermo-sensor 22, so that the semiconductor substrate 11 is heated to and at 50° to 100° C. Then, the developer 14 is supplied through the pipe 26 onto the surface of the resist film on the semiconductor substrate 11. Thus, the resist film is developed in accordance with a pattern transferred in advance thereon. At the same time, the power supply 16 is turned on to activate the heater 17, so that the thermal medium 20 is heated to transfer the heat to the rinsing liquid 15. Subsequently to the development of the resist film on the semiconductor substrate 11, the developed resist pattern is rinsed by the heated rinsing liquid 15. The rinsing liquid 15 is reduced in surface tension by the temperature increase based on the heating thereof, so that the rinsing liquid 16 is well flown into the minute interstices of the resist pattern by reduced surface tension. Consequently, the collapse of the resist pattern is effectively avoided, even if it is extremely minute.

Figure 2A:
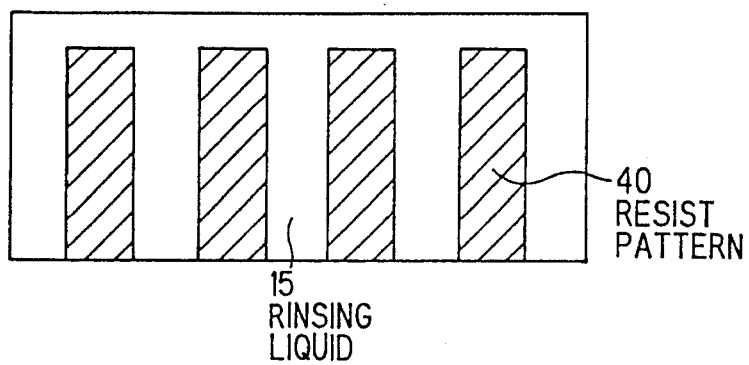
FIG. 2A to 2E are schematic cross sectional views explaining the collapse of a photoresist pattern.
Figure 2B:
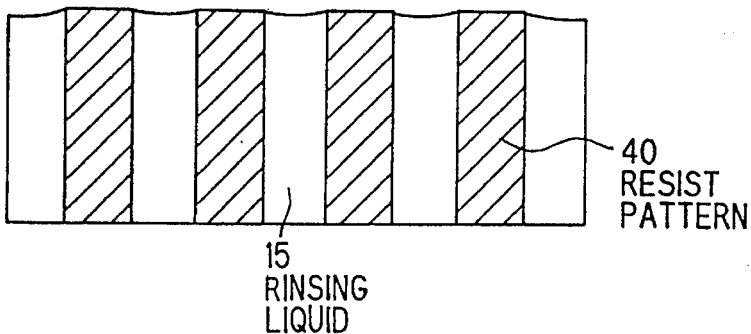
Figure 2C:
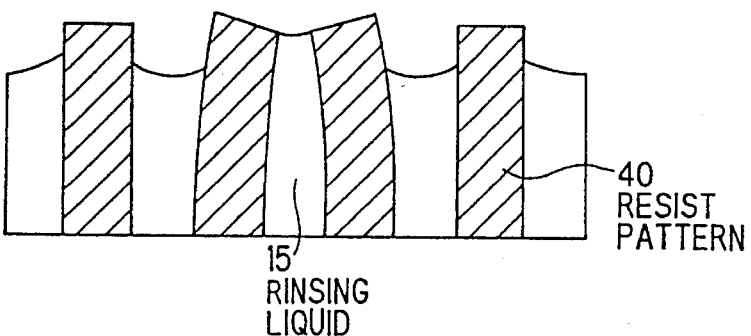
Figure 2D:
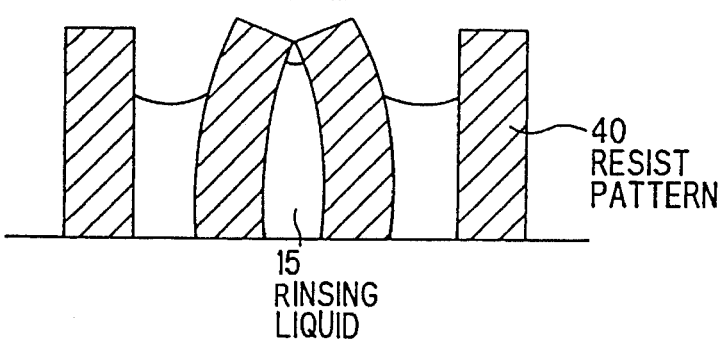
Figure 2E:
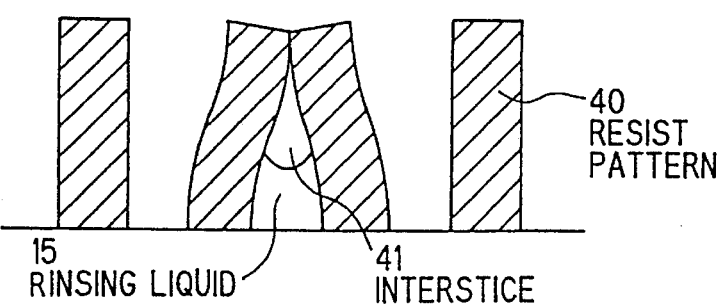

FIGS. 2A to 2E show the rinsing liquid 15 supplied on the photoresist pattern 40 on the semiconductor substrate 11 (not shown in FIGS. 2A to 2E, but in FIG. 1). The rinsing liquid 15 is evaporated to be thinner as a liquid layer, especially, as shown in FIGS. 2C to 2E, and the photoresist pattern 40 may be collapsed due to the surface tension of the rinsing liquid 15 in an interstice of the photoresist pattern 40, unless the rinsing liquid 15 is heated as in the conventional method for developing a photoresist pattern. The surface tension of the rinsing liquid 15 remarkably affects the photoresist patten 40, when the liquid layer is approximately equal to the height of the photoresist pattern 40 to be exposed at the top thereof to the outer atmosphere, as shown in FIG. 2C. Then, the collapse of the photoresist pattern 40 may start, and adjacent layers become contacted, as shown in FIG. 2E. On the contrary, the collapse of the photoresist pattern 40 is avoided in the invention, because the surface tension of the rinsing liquid 15 is reduced in accordance with the heating of the rinsing liquid 15.

Figure 3:
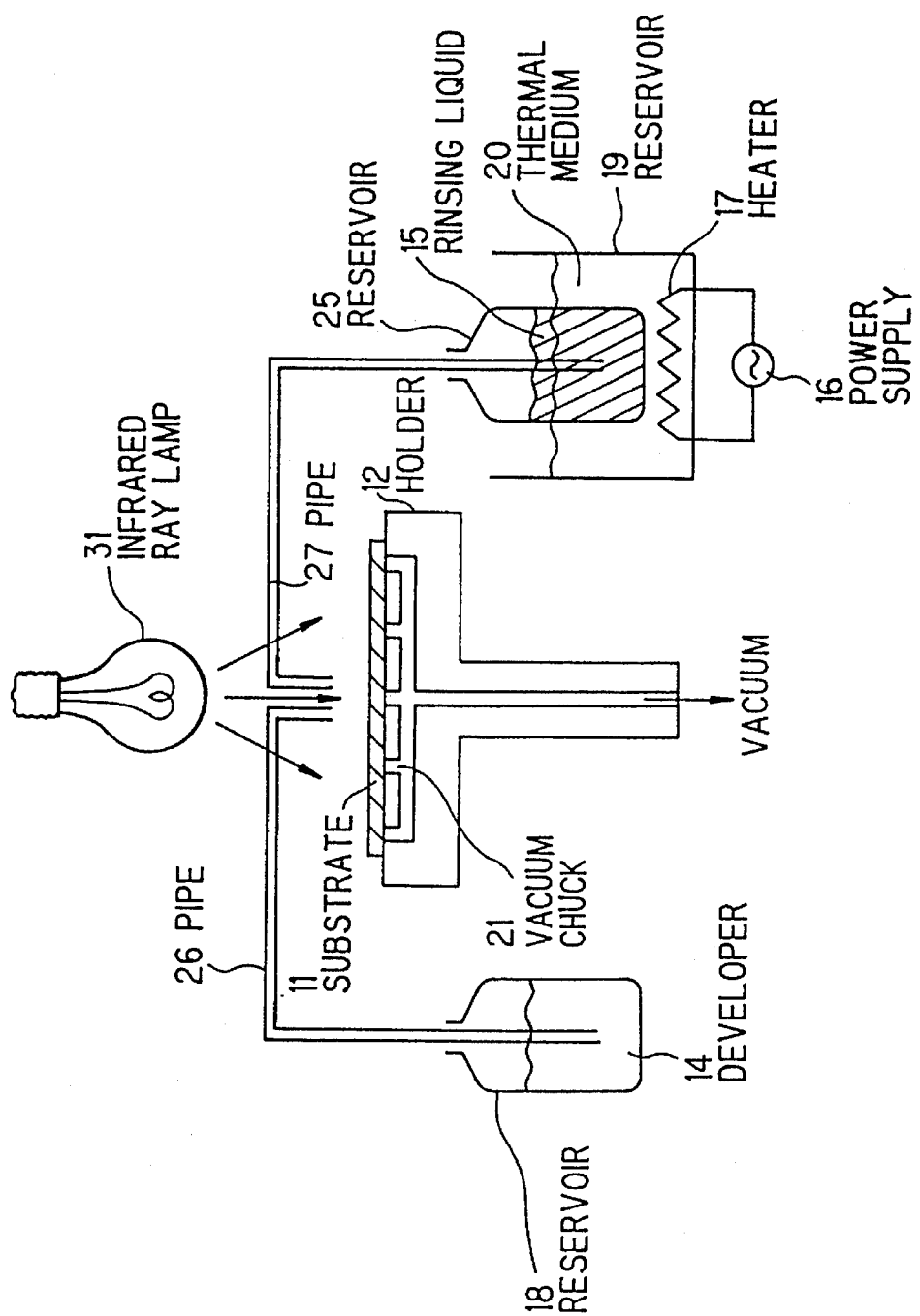
FIGS. 3, 4A and 4B, and 5 are explanatory views explaining a method for developing a photoresist pattern in second to fourth preferred embodiments according to the invention.

FIG. 3 shows an apparatus for developing a photoresist pattern used for a method for developing a photoresist pattern in the second preferred embodiment according to the invention, wherein like parts are indicated by like reference numerals as used in FIG. 1, and the control unit 24, etc. are not shown for simple illustration.

In the apparatus, an infrared ray lamp 31 is provided to heat the semiconductor substrate 11 at the rinsing step, so that the rinsing liquid 15 is effectually heated on the semiconductor substrate 11. This apparatus is advantageously used in the case where a number of semiconductor substrates are continuously processed, because each semiconductor substrate is suppressed in temperature increase at the developing step.

Figure 4A:
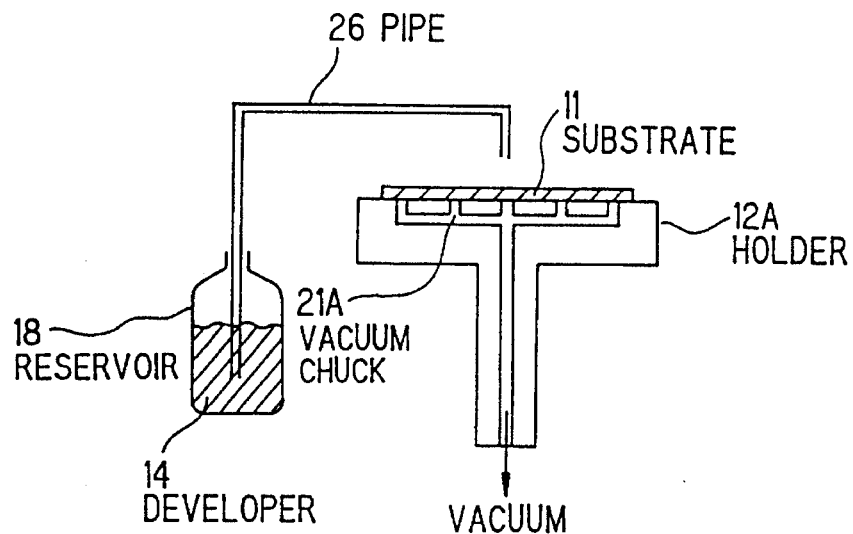
Figure 4B:
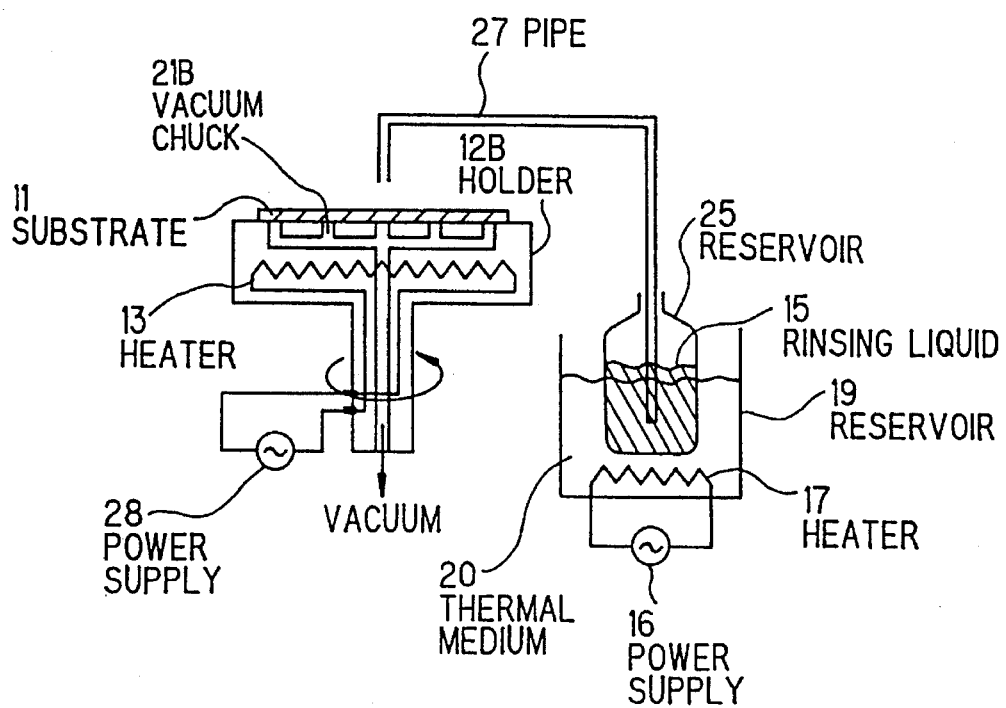

FIGS. 4A and 4B show an apparatus used for a method for developing a photoresist pattern in the third preferred embodiment according to the invention, wherein like parts are indicated by like reference numerals as used in FIGS. 1 and 3. In the apparatus, a semiconductor substrate holder 12A having a vacuum chuck 21A is used at the developing step, and a semiconductor substrate holder 12B is used at the rinsing step. As is apparent from the illustration of FIGS. 4A and 4B, the developing of a photoresist pattern, and the rinsing thereof are carried out on the different holders 12A and 12B. Consequently, the semiconductor substrate 11 is suppressed in temperature increase at the developing step, even if a number of semiconductor substrates are continuously processed. On the contrary, the rinsing liquid 15 and the semiconductor substrate 11 are heated to be increased in temperature at the rinsing step.

Figure 5:
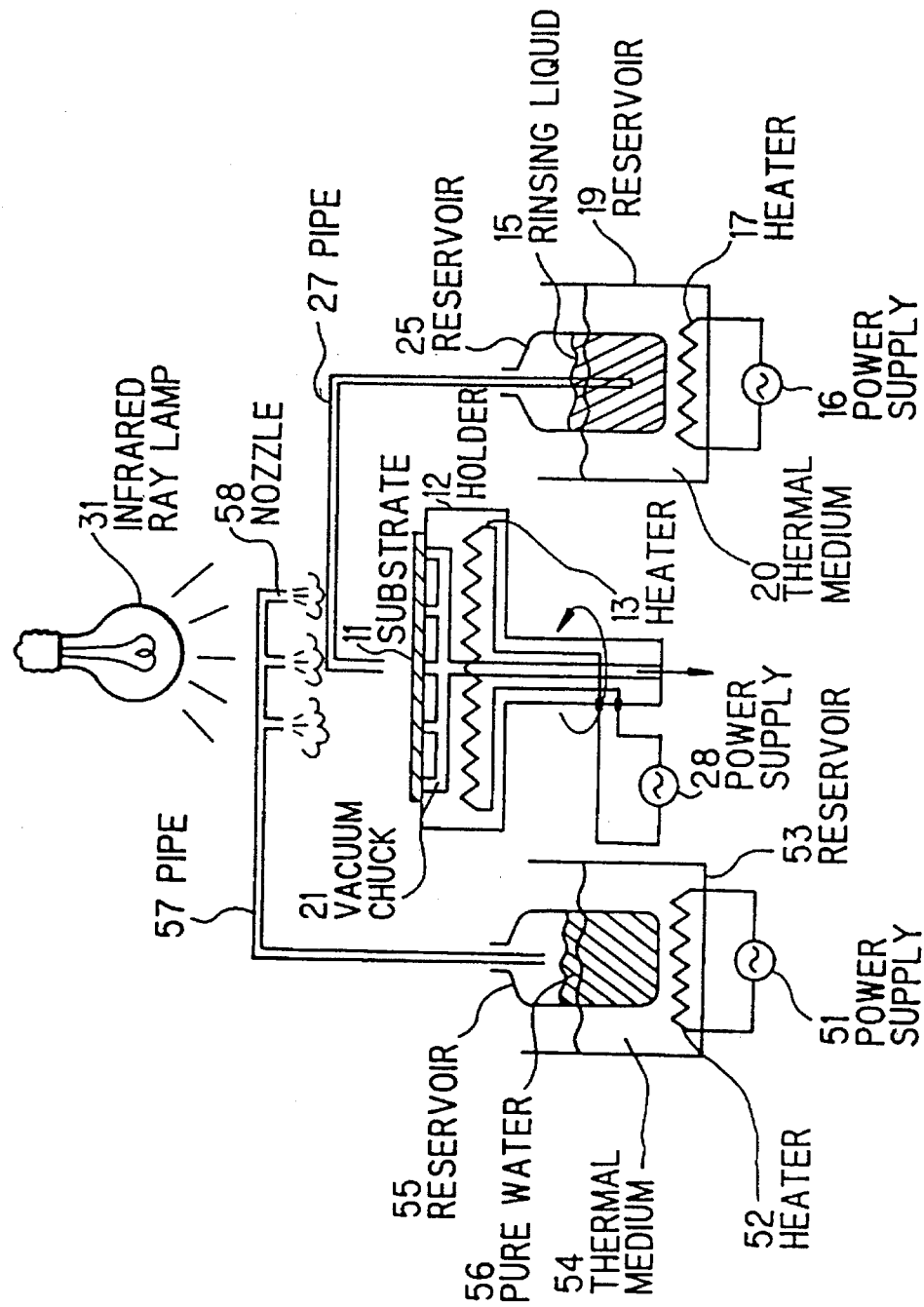

FIG. 5 shows an apparatus used for a method for developing a photoresist pattern in the fourth preferred embodiment according to the invention, wherein like parts are indicated by like reference numerals as used in FIGS. 1, 3, 4A and 4B. The apparatus comprises a water vapor (steam) supply mechanism which comprises a heater 52 energized by a power supply 51, a reservoir 53 for containing thermal medium 54 to be heated by the heater 52, a reservoir 55 for containing pure water 56 to be heated by the thermal medium 54, and a pipe 57 for transporting steam to be supplied on a developed photoresist from nozzles 58 provided at the end thereof.

In the fourth preferred embodiment, the effect of reducing the surface tension of the rinsing liquid 15 is more enhanced by supplying the steam from the nozzles 58 on the developed photoresist pattern and by heating the rinsing liquid 15 and the semiconductor substrate 11 by the heaters 13 and 17.

Although the invention has been described with respect to specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A method for developing a photoresist pattern, comprising the steps of:

coating a photoresist film on a semiconductor substrate;

exposing said photoresist film on said semiconductor substrate to a predetermined pattern;

supplying developer on said photoresist film on said semiconductor substrate to develop said photoresist pattern;

heating rinsing liquid to its boiling point or within several degrees thereof; and thereafter supplying said heated rinsing liquid on said photoresist pattern developed on said semiconductor substrate to rinse said photoresist pattern, while separately heating a surface of said semiconductor substrate having said photoresist pattern thereon to a predetermined temperature of 50° to 100° C. during said rinsing liquid supplying step.

2. A method for developing a photoresist pattern, according to claim 1, wherein:

said surface of said semiconductor substrate is heated to said predetermined temperature by heating a support on which said semiconductor substrate is supported.

3. A method for developing a photoresist pattern, according to claim 1, wherein:

said rinsing liquid is at least one of water and alcohol; and said predetermined temperature is the boiling point of said rinsing liquid.

4. A method for developing a photoresist pattern, according to claim 1, wherein:

said semiconductor substrate is fixed on a first semiconductor substrate holder at said developer supplying step, and on a second semiconductor substrate holder at said rinsing liquid supplying step.

5. A method for developing a photoresist pattern, according to claim 1, wherein:
  said surface of said semiconductor substrate is heated to be said predetermined temperature by an infrared ray lamp.

6. A method for developing a photoresist pattern, according to claim 1, wherein said heating of said surface is effected by
  supplying steam on said photoresist pattern developed on said semiconductor substrate during said rinsing liquid supplying step.

* * * * *